(12) United States Patent
Zhang et al.

(10) Patent No.: US 9,373,542 B2
(45) Date of Patent: Jun. 21, 2016

(54) INTEGRATED CIRCUITS AND METHODS FOR FABRICATING INTEGRATED CIRCUITS WITH IMPROVED CONTACT STRUCTURES

(71) Applicant: GLOBALFOUNDRIES, Inc., Grand Cayman (KY)

(72) Inventors: Xunyuan Zhang, Albany, NY (US); Xiuyu Cai, Niskayuna, NY (US); Hoon Kim, Guilderland, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 138 days.

(21) Appl. No.: 14/081,749

(22) Filed: Nov. 15, 2013

(65) Prior Publication Data

US 2015/0137373 A1 May 21, 2015

(51) Int. Cl.
  *H01L 21/768* (2006.01)
  *H01L 23/485* (2006.01)
  *H01L 23/532* (2006.01)
  *H01L 21/285* (2006.01)

(52) U.S. Cl.
  CPC .... *H01L 21/76846* (2013.01); *H01L 21/28518* (2013.01); *H01L 21/76831* (2013.01); *H01L 21/76855* (2013.01); *H01L 21/76879* (2013.01); *H01L 23/485* (2013.01); *H01L 23/53238* (2013.01); *H01L 23/53266* (2013.01); *H01L 2924/0002* (2013.01)

(58) Field of Classification Search
  CPC ............ H01L 21/76846; H01L 23/485; H01L 23/53266; H01L 23/53238; H01L 21/76895; H01L 21/76883
  See application file for complete search history.

(56) References Cited

U.S. PATENT DOCUMENTS

| | | | |
|---|---|---|---|
| 5,236,852 A * | 8/1993 | Cherniawski et al. | 438/297 |
| 6,010,958 A * | 1/2000 | Chen et al. | 438/626 |
| 8,372,739 B2 * | 2/2013 | Ishizaka et al. | 438/597 |
| 2014/0084466 A1 * | 3/2014 | Matsumoto et al. | 257/741 |

* cited by examiner

*Primary Examiner* — David Vu
(74) *Attorney, Agent, or Firm* — Ingrassia Fisher & Lorenz, P.C.

(57) ABSTRACT

Integrated circuits with improved contact structures and methods for fabricating integrated circuits with improved contact structures are provided. In an exemplary embodiment, a method for fabricating integrated circuits includes providing a device in and/or on a semiconductor substrate. Further, the method includes forming a contact structure in electrical contact with the device. The contact structure includes silicate barrier portions overlying the device, a barrier metal overlying the device and positioned between the silicate barrier portions, and a fill metal overlying the barrier metal and positioned between the silicate barrier portions.

20 Claims, 2 Drawing Sheets

INTEGRATED CIRCUITS AND METHODS FOR FABRICATING INTEGRATED CIRCUITS WITH IMPROVED CONTACT STRUCTURES

TECHNICAL FIELD

The technical field generally relates to integrated circuits and methods for fabricating integrated circuits, and more particularly relates to integrated circuits and methods for fabricating integrated circuits with contact structures that exhibit reduced electrical resistance.

BACKGROUND

Advanced integrated circuits typically contain a great number of semiconductor devices, such as transistors, capacitors, resistors and the like, which are formed on an appropriate substrate including a crystalline semiconductor layer. The integrated circuits further include contact structures that are used to electrically interconnect the semiconductor devices and overlying metallization layers.

Due to the continuous reduction of the feature sizes of semiconductor devices in modern integrated circuits, the number of contact structures for a given chip area, that is, the contact structure packing density, is increasing. This increase in contact structure packing density requires reduced feature sizes for contact structures. Reduced feature size for contact structures results in an increase in contact resistance. Therefore, increased contact resistance is an ongoing issue for the further reduced feature size of contact structures.

Conventional integrated circuit fabrication processes typically utilize a tungsten plug or fill metal that is encapsulated by a dual liner and cap. Typically the dual liner is formed from a titanium layer and a titanium nitride layer. The titanium layer is provided to reduce contact resistance between the contact structure and the underlying device or device contact. The titanium nitride layer is provided to block migration of any fluorine ions out of the fill metal, particularly a tungsten fill metal, and to provide a wetting layer for the deposition of the fill metal. As feature size is reduced, the dual liner consumes an increasing amount of chip area relative to the fill metal portion of the contact structure.

Accordingly, it is desirable to provide integrated circuits having improved contact structures and methods for fabricating such integrated circuits. In addition, it is desirable to provide integrated circuits having contact structures with reduced thickness barriers. Also, it is desirable to provide integrated circuits having contact structures with silicate barriers. Furthermore, other desirable features and characteristics will become apparent from the subsequent detailed description and the appended claims, taken in conjunction with the accompanying drawings and the foregoing technical field and background.

BRIEF SUMMARY

Integrated circuits with improved contact structures and methods for fabricating integrated circuits with improved contact structures are provided. In one embodiment, a method for fabricating integrated circuits includes providing a device in and/or on a semiconductor substrate. Further, the method includes forming a contact structure in electrical contact with the device. The contact structure includes silicate barrier portions overlying the device, a barrier metal overlying the device and positioned between the silicate barrier portions, and a fill metal overlying the barrier metal and positioned between the silicate barrier portions.

In accordance with another embodiment, a method is provided for fabricating an integrated circuit. The method for fabricating integrated circuits includes providing a device in and/or on a semiconductor substrate. The method deposits a dielectric material overlying the device and etches the dielectric material to form a trench and to expose the device. The method includes forming a barrier material in the trench and reacting portions of the barrier material with the dielectric material to form silicate barriers on sidewalls of the trench. The method further includes filling the trench with metal to form a contact structure.

In another embodiment, an integrated circuit is provided. The integrated circuit includes a device in and/or on a semiconductor substrate. Further, the integrated circuit includes a contact structure in electrical contact with the device. The contact structure includes a fill metal positioned over a metal barrier layer configured to block migration of fluorine. The fill metal is positioned between silicate barriers configured to block migration of fluorine.

BRIEF DESCRIPTION OF THE DRAWINGS

Embodiments of integrated circuits and methods for fabricating integrated circuits with improved contact structures will be described in conjunction with the following drawing figures, wherein like numerals denote like elements, and wherein.

DETAILED DESCRIPTION

The following detailed description is merely exemplary in nature and is not intended to limit the integrated circuits or the methods for fabricating integrated circuits claimed herein. Furthermore, there is no intention to be bound by any expressed or implied theory presented in the preceding technical field, background or brief summary, or in the following detailed description.

Integrated circuits and methods for fabricating integrated circuits with improved contact structures as described herein avoid issues faced by conventional integrated circuits. For example, conventional processes for fabricating integrated circuits utilize device contact structures with a dual barrier layer that serves to reduce contact resistance, to provide a barrier to any fluorine migration, and to provide wetting for the later deposition of fill metal. As scaling of integrated circuits continues, the thickness of the dual layer becomes greater in relation to the thickness of the fill metal of the contact structure. The methods and integrated circuits described herein provide reduced contact resistance and a barrier to fluorine migration without the conventionally used dual layer. Instead, an exemplary embodiment utilizes a thin barrier layer that is processed to form a silicide region and silicate regions. The silicide region reduces contact resistance to the underlying device while the silicate regions block fluorine migration from the fill metal. A conductive metal barrier may be formed over the silicide region and under the fill metal to block fluorine migration without reducing the volume of conductive fill material in the contact structure. Further, the silicide region allows for deposition of the fill metal without requiring an additional wetting layer.

FIGS. 1-7 illustrate partially completed integrated circuits and methods for fabricating integrated circuits in accordance with various embodiments. Various steps in the design and composition of integrated circuits are well known and so, in the interest of brevity, many conventional steps will only be mentioned briefly herein or will be omitted entirely without providing the known process details. Further, it is noted that integrated circuits include a varying number of components and that single components shown in the illustrations may be representative of multiple components.

Figure 1:
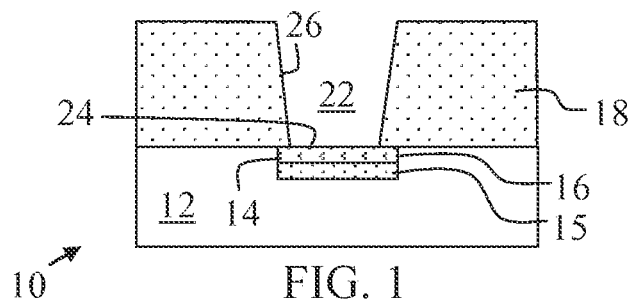
FIGS. 1-7 are cross-sectional views of a portion of an integrated circuit illustrating method steps for fabricating the integrated circuit in accordance with various embodiments herein.

In FIG. 1, in an exemplary embodiment, a method for fabricating an integrated circuit 10 includes providing a semiconductor substrate 12. The semiconductor substrate 12 is preferably a silicon substrate (the term "silicon substrate" encompassing the relatively pure silicon materials typically used in the semiconductor industry as well as silicon admixed with other elements, such as germanium and the like). Alternatively, semiconductor substrate 12 can be realized as germanium, gallium arsenide, and the like, or the semiconductor substrate 12 can include layers of different semiconductor materials. The semiconductor substrate 12 can be formed as a bulk wafer or as a silicon-on-insulator (SOI) substrate.

In FIG. 1, a device 14 is formed on the semiconductor substrate 12. For purposes of illustration, the device 14 may include an active source/drain region 15 of a transistor formed on and/or within the semiconductor substrate 12 and a silicide layer 16 formed on the source/drain region 15. Alternatively, the device 14 may include a gate structure of a transistor formed on and/or within the semiconductor substrate 12, and a silicide layer 16 formed on the gate structure. Silicide layers 16 may be formed on the active source/drain regions and/or the gate structure of the transistor according to conventional processing. While the illustrated device 14 is formed in the semiconductor substrate 12, the device 14 may be formed overlying the semiconductor substrate 12, or within and overlying the semiconductor substrate 12. As used herein, "overlying" means "on" and "over". In this regard, the device 14 may lie directly on the semiconductor substrate 12 such that it makes physical contact with the semiconductor substrate 12 or it may lie over the semiconductor substrate 12 such that another material layer is interposed between the semiconductor substrate 12 and the device 14.

In FIG. 1, a dielectric material 18 is formed over the device 14 and semiconductor substrate 12. An exemplary dielectric material 18 is silicon oxide. The dielectric material 18 may be deposited over the device 14 and semiconductor substrate 12 by chemical vapor deposition (CVD) or other suitable process. A trench 22 is etched into the dielectric material 18 to expose at least a portion of the device 14 at a contact site 24, for example at the gate electrode and/or active source/drain regions (including silicide layers 16, if utilized) of the device 14. As shown, the trench 22 is defined by sidewalls 26 of the dielectric material 18. In an exemplary embodiment, the trench 22 is formed by performing a reactive ion etch (RIE) process with a patterned mask (not shown) overlying the dielectric material 18.

Figure 2:
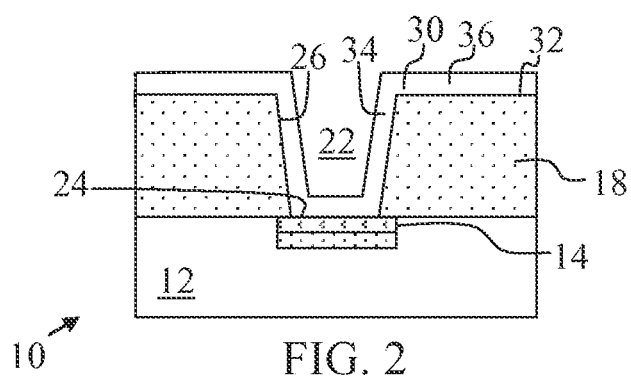

In FIG. 2, a barrier layer 30 is formed over the partially completed integrated circuit 10. Specifically, the barrier layer 30 is deposited over the contact site 24 of the device 14, over the trench sidewalls 26, and over an upper surface 32 of the dielectric material 18. The barrier layer 30 includes a trench portion 34 in the trench 22 and an overburden portion 36 over the upper surface 32 of the dielectric material 18. In an exemplary embodiment, the barrier layer 30 is deposited by a chemical vapor deposition (CVD) process or an atomic layer deposition (ALD). The exemplary barrier layer 30 is formed with a thickness of less than about 20 Angstroms (Å), for example less than about 15 Å, such as about 5 Å to about 10 Å. Also, in an exemplary embodiment, the barrier layer 30 is formed from a barrier material, such as a manganese-containing material like manganese or a manganese nitride. As discussed below, a suitable barrier material will form a silicide contact when contacted with a silicide and oxygen during an anneal process and will form a silicate barrier when contacted with the dielectric material 18 during the anneal process. Alternatively, the barrier layer 30 may be formed from titanium, tantalum, aluminum, lanthanum, or other metals having strong reducing behavior.

Figure 3:
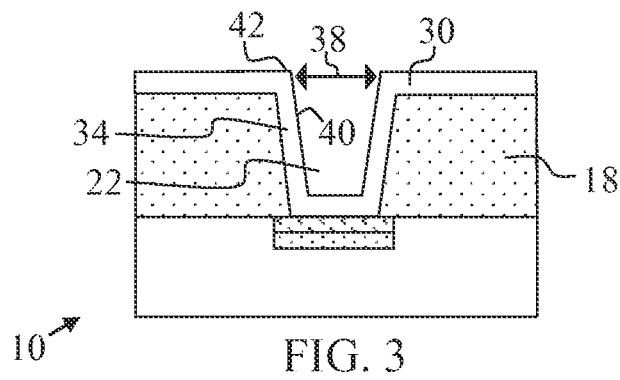

In FIG. 3, the barrier layer 30 defines a trench width or distance, indicated by double-headed arrow 38, between opposing inner surfaces 40 of its trench portions 34 that has maximum value at upper ends 42 of the trench portions 34. Upper ends 42 are those ends of trench portions 34 closest to the opening of trench 22.

Figure 4:
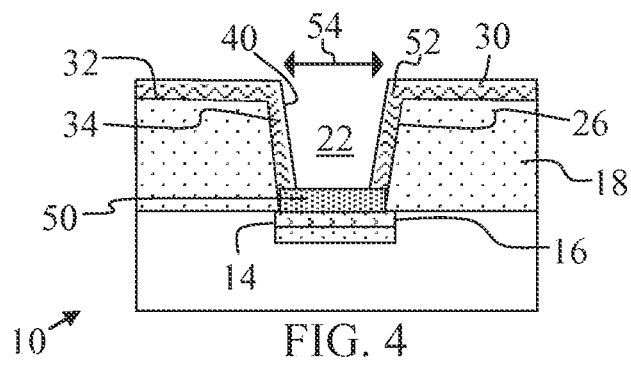

The method may continue in FIG. 4 with an anneal process. In an exemplary embodiment, the anneal is performed at a temperature of about 250° C. to about 350° C., for example about 300° C. The exemplary anneal is performed for a duration of less than about ten minutes, such as about five minutes. During the anneal process, a silicide reaction and a silicate reaction simultaneously occur. Specifically, a portion of the exemplary barrier layer 30 draws oxygen from the silicide layer 16 into the barrier material and undergoes silicidation to form a silicide region 50. For example, a manganese or manganese nitride barrier layer 30 will form a manganese silicide region 50. The silicide region 50 may have a thickness equal to or less than the initial thickness of the barrier layer 30, for example less than about 20 Å or less than about 15 Å, such as about 5 Å to about 10 Å.

Further, during the anneal process, portions of the exemplary barrier layer 30 will react with the dielectric material 18 along the sidewalls 26 the upper surface 32 to form a silicate layer 52 along each sidewall 26 and along the upper surface 32. The reaction between the barrier layer 30 and the dielectric material 18 will consume a portion of the dielectric material 18 at the sidewalls 26 and the upper surface 32 and will slightly widen the trench 22, i.e., form an increased distance, indicated by double-headed arrow 54, between opposing the inner surfaces 40 of trench portions 34. Increased distance 54 is greater than distance 38 of FIG. 3. The increased distance 54 between opposing inner surfaces 40 provides for an increased volume of fill metal for contact formation relative to conventional processes. The reaction between the barrier layer 30 and the dielectric material 18 may convert substantially all of the barrier layer 30, or a portion of the barrier layer 30, formed on the sidewalls 26 to silicate. The silicate layer 52 thus may have a thickness of less than about 20 Å, for example less than about 15 Å, such as about 5 Å to about 10 Å, or less than about 5 Å, such as about 2 Å to about 4 Å. In an exemplary embodiment, a manganese or manganese nitride barrier layer 30 reacts with a silicon oxide dielectric material 18 to form a manganese silicate layer 52. The exemplary silicate layer 52 blocks the migration of fluorine ions.

Figure 5:
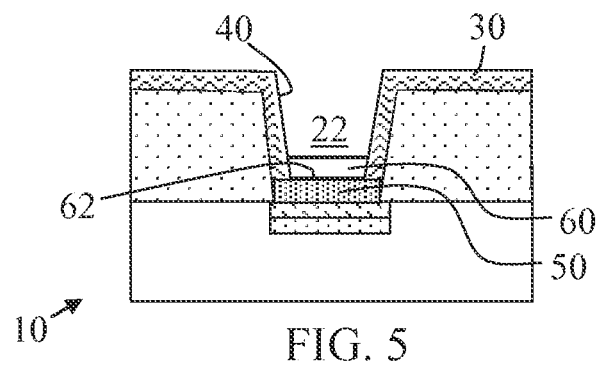

In FIG. 5, the method may continue with the formation of barrier metal layer 60 at the bottom 62 of the trench 22. Specifically, the barrier metal layer 60 may be formed over the silicide region 50. In an exemplary embodiment, the barrier metal layer 60 is selectively deposited by an atomic layer deposition (ALD) process onto the silicide region 50. An exemplary barrier metal layer 60 is a barrier for fluorine. For example, the barrier metal layer 60 may be fluorine free tungsten. Fluorine free tungsten is selectively grown on metal during an atomic layer deposition (ALD) process. Specifically, the ALD process requires nucleation sites for formation of the fluorine free tungsten that are only present on the silicide region 50 and not on the barrier layer 30. Therefore, a fluorine free tungsten barrier metal layer 60 may be selectively deposited on the silicon region 50 without forming on the opposing inner surfaces 40 of the barrier layer 30 (whether composed of the barrier material or of silicate). In this regard, the fluorine free tungsten barrier metal layer 60 grows up from the bottom 62 of the trench, but not inward from the inner surfaces 40. In an exemplary embodiment, the barrier metal layer 60 is formed with a height of about 5 Å to about 10 Å.

Figure 6:
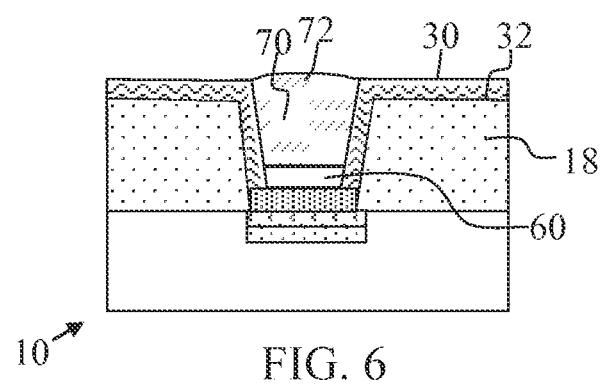

The method may continue in FIG. 6 with filling the trench with a fill metal 70. In an exemplary process, the fill metal 70 is deposited on the barrier metal layer 60 and grows upward to fill the trench. An exemplary process for depositing fill metal 70 is chemical vapor deposition (CVD). An exemplary fill metal 70 is tungsten, copper, ruthenium or nickel. A typical CVD process for depositing tungsten may form the tungsten with fluorine incorporated therein. An exemplary CVD process for depositing fill metal 70 requires nucleation sites that are only present on the barrier metal layer 60 and not on the barrier layer 30. As shown, the fill metal 70 may grow beyond the upper surface 32 of the dielectric material 18 to form an overburden portion 72.

Figure 7:
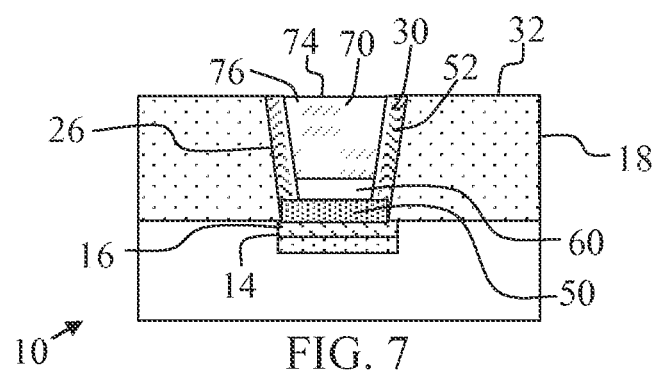

In FIG. 7, the overburden portion 72 of the fill metal 70 and the overburden portion 36 of the barrier layer 30 are removed, such as by a chemical mechanical planarization (CMP) process, and the fill metal 70 is formed with an upper surface 74 coplanar with the upper surface 32 of the dielectric material 18. As a result, a contact structure 76 is formed as illustrated in FIG. 7. The contact structure 76 forms an electrical path from the device 14 through the silicide layer 16, silicide region 50, barrier metal layer 60, and fill metal 70. The barrier metal layer 60 forms a barrier to migratory ions, such as fluorine ions. Further, the barrier layer 30, whether formed entirely of silicate 52 or of barrier material and silicate 52, forms a barrier to migratory ions, such as fluorine ions. As a result, migration of fluorine that may be present in the fill metal 70 is inhibited. As shown in FIG. 7, the barrier metal layer 60 and the fill metal 70 are positioned between and bounded by barrier layer 30, and more specifically by the portions of the barrier layer 30 adjacent the trench sidewalls. Further processing may include the deposition of a capping layer over the contact structure, deposition of additional dielectric layers, and formation of electrical interconnect structures to complete the integrated circuit 10.

The integrated circuit 10 formed according to the methods described herein exhibits improved electrical performance. Specifically, the thickness of the non-conductive portion of the contact structure 76, i.e., the barrier liner 30, is reduced as the silicate 52 formed from the barrier layer 30 and the dielectric material 18 is able to prevent migration of selected ion species out of the fill metal 70 with a smaller thickness, relative to conventional barrier layers. As a result, the fill metal 70 (and barrier metal layer 60) may form an increased percentage of the overall width of the contact structure and provide reduced electrical resistance. Also, resistance between the device 14 and the fill metal 70 is reduced as compared to conventional contact structures, due to the formation of the silicide region 50 from the barrier layer 30 and the use of the barrier metal layer 60 to inhibit ion migration.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating integrated circuits, the method comprising:
   providing a device in and/or on a semiconductor substrate, wherein the device includes a silicide layer forming an upper surface thereof; and
   forming a contact structure in electrical contact with the device, wherein the contact structure comprises a silicide region on and encapsulating the upper surface of the device, silicate barrier portions on the silicide region and overlying the device, a barrier metal overlying the device and positioned between the silicate barrier portions, and a fill metal overlying the barrier metal and positioned between the silicate barrier portions.

2. The method of claim 1 wherein forming the contact structure overlying the device comprises:
   depositing a barrier layer overlying the semiconductor substrate; and
   reacting the barrier layer to form a silicide region overlying the device and the silicate barrier portions.

3. The method of claim 1 wherein a silicide layer is provided on the device and wherein forming a contact structure overlying the device comprises:
   depositing a barrier layer on the silicide layer; and
   reacting the barrier layer with the silicide layer to form a silicide region from a portion of the barrier layer.

4. The method of claim 1 wherein forming a contact structure overlying the device comprises:
   depositing a barrier layer overlying the device;
   siliciding a portion of the barrier layer to form a silicide region on the device; and
   reacting remaining portions of the barrier layer with a dielectric material to form the silicate barrier portions.

5. The method of claim 4 wherein forming a contact structure overlying the device further comprises depositing the barrier metal over the silicide region and between the silicate barrier portions.

6. The method of claim 5 wherein forming a contact structure overlying the device further comprises depositing the fill metal overlying the barrier metal and between the silicate barrier portions.

7. The method of claim 1 wherein forming a contact structure overlying the device comprises:
   depositing a manganese-containing barrier layer overlying the device;
   siliciding a portion of the manganese-containing barrier layer to form a manganese silicide region on the device; and
   reacting remaining portions of the manganese-containing barrier layer with a dielectric material to form manganese silicate barrier regions.

8. The method of claim 7 wherein forming a contact structure overlying the device further comprises:
   depositing a fluorine free tungsten barrier metal over the manganese silicide region and between the manganese silicate barrier regions; and
   depositing a tungsten fill metal overlying the fluorine free tungsten barrier metal and between the manganese silicate barrier regions.

9. The method of claim 1 further comprising:
   depositing a dielectric material overlying the semiconductor substrate; and etching the dielectric material to form a trench and expose the device, wherein forming a contact structure overlying the device comprises forming a contact structure in the trench.

10. The method of claim 1 further comprising:
depositing a dielectric material overlying the semiconductor substrate; and
etching the dielectric material to form a trench and expose the device, wherein forming a contact structure overlying the device comprises:
depositing a barrier layer overlying the trench and on the device; and
reacting portions of the barrier layer with the dielectric material to form the silicate barrier portions.

11. The method of claim 1 wherein forming the contact structure overlying the device comprises:
depositing a barrier layer overlying the semiconductor substrate; and
reacting the barrier layer to form the silicate barrier portions overlying the device and to form a silicide region overlying the device, wherein the silicide region extends from one silicate barrier portion to the other silicate barrier portion.

12. A method for fabricating integrated circuits, the method comprising:
providing a device in and/or on a semiconductor substrate, wherein the device has an upper surface;
depositing a dielectric material overlying the device;
etching the dielectric material to form a trench and to expose the upper surface of the device;
forming a barrier material in the trench;
reacting portions of the barrier material with the dielectric material to form silicate barrier layers on sidewalls of the trench and reacting a remaining portion of the barrier material to form a silicide region on the upper surface of the device; and
filling the trench with metal to form a contact structure.

13. The method of claim 12 wherein the silicide region on the upper surface of the device completely covers the upper surface of the device.

14. The method of claim 12 wherein providing the device in and/or on the semiconductor substrate includes forming a silicide layer as an upper surface of the device; and wherein reacting the remaining portion of the barrier material to form the silicide region overlying the device comprises reacting the remaining portion of the barrier material with the silicide layer to form the silicide region.

15. The method of claim 12 wherein providing the device in and/or on the semiconductor substrate includes forming a silicide layer as an upper surface of the device; and
wherein reacting the remaining portion of the barrier material to form the silicide region overlying the device comprises reacting the remaining portion of the barrier material with the silicide layer to form the silicide region, wherein a single anneal process comprises simultaneously reacting the barrier material with the dielectric material and reacting the barrier material with the silicide layer.

16. The method of claim 12 wherein reacting the remaining portion of the barrier material forms the silicide region on the device.

17. The method of claim 12 wherein forming a barrier material in the trench comprises forming a manganese-containing material in the trench, wherein providing the device in and/or on the semiconductor substrate includes forming a silicide layer as an upper surface of the device; and wherein the method further comprises reacting the manganese-containing material with the silicide layer to form a manganese silicide region.

18. A method for fabricating integrated circuits, the method comprising:
providing a device having an upper surface;
depositing a dielectric material overlying the device;
etching the dielectric material to form a trench having sidewalls and exposing the upper surface of the device;
selectively forming silicate barrier portions on the sidewalls of the trench and a silicide region on the upper surface of the device; and
filling the trench with metal to form a contact structure.

19. The method of claim 18 wherein each silicate barrier portion has an inner surface, and wherein the silicide region contacts the inner surface of each silicate barrier portion and extends from the inner surface of one silicate barrier portion to the inner surface of the other silicate barrier portion.

20. The method of claim 18 wherein selectively forming the silicate barrier portions on the sidewalls of the trench and the silicide region on the upper surface of the device comprises:
depositing a barrier material on the sidewalls of the trench and on the upper surface of the device; and
annealing the barrier material to form the silicate barrier portions and the silicide region.

* * * * *